United States Patent
Kamikawa (10) Patent No.: US 9,004,079 B2
(45) Date of Patent: Apr. 14, 2015

(54) SUBSTRATE PROCESSING APPARATUS

(75) Inventor: Yuji Kamikawa, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 918 days.

(21) Appl. No.: 13/078,360

(22) Filed: Apr. 1, 2011

(65) Prior Publication Data

US 2011/0247662 A1     Oct. 13, 2011

(30) Foreign Application Priority Data

Apr. 8, 2010   (JP) ................................. 2010-089468

(51) Int. Cl.
  *H01L 21/677* (2006.01)
  *B08B 3/00* (2006.01)
  *H01L 21/67* (2006.01)

(52) U.S. Cl.
  CPC .... *H01L 21/67057* (2013.01); *H01L 21/67763* (2013.01); *H01L 21/67772* (2013.01); *H01L 21/67034* (2013.01)

(58) Field of Classification Search
  CPC ................... H01L 21/67057; H01L 21/67034; H01L 21/6704; H01L 21/67763; H01L 21/6772; H01L 21/67772; H01L 21/6773; B08B 3/00; F26B 3/00; F26B 3/18; F26B 3/20
  USPC .............. 134/85, 90, 91, 95.2, 105, 147, 902, 134/117; 34/337, 343, 391, 393, 467, 62, 34/218
  See application file for complete search history.

(56) References Cited

U.S. PATENT DOCUMENTS

| | | | | |
|---|---|---|---|---|
| 3,710,450 A | * | 1/1973 | Figiel | 34/337 |
| 4,370,192 A | * | 1/1983 | Cooley | 156/345.15 |
| 5,320,163 A | * | 6/1994 | Stoodley | 165/80.5 |
| 5,671,544 A | * | 9/1997 | Yokomizo et al. | 34/78 |
| 6,334,266 B1 | * | 1/2002 | Moritz et al. | 34/337 |
| 6,410,888 B2 | * | 6/2002 | Pan | 219/390 |
| 6,928,746 B2 | * | 8/2005 | Arena-Foster et al. | 34/351 |
| 2005/0180107 A1 | * | 8/2005 | Naganawa et al. | 361/699 |
| 2005/0224102 A1 | * | 10/2005 | Kim | 134/94.1 |
| 2005/0227503 A1 | * | 10/2005 | Reitinger | 438/795 |

FOREIGN PATENT DOCUMENTS

| | | |
|---|---|---|
| JP | 63-179530 A | 7/1988 |
| JP | 05-259136 A | 10/1993 |
| JP | 2003-092326 A | 3/2003 |
| JP | 2006-066698 A | 3/2006 |
| JP | 2007-049065 A | 2/2007 |
| JP | 2008-72118 A | 3/2008 |

* cited by examiner

*Primary Examiner* — Joseph L Perrin
*Assistant Examiner* — Kevin G Lee
(74) *Attorney, Agent, or Firm* — Abelman, Frayne & Schwab (57) ABSTRACT

Disclosed is a substrate processing apparatus capable of drying a substrate to be processed while suppressing the pattern collapse or the occurrence of contamination. A substrate is held in a liquid bath while being immersed in a liquid, and the liquid bath is disposed in a processing space of a processing vessel. A processing of drying the substrate is performed by replacing the liquid in the liquid bath with a supercritical-state fluid. A predetermined mechanism moves liquid bath between a processing location in the processing case and a stand-by location outside the processing case. A heater installed in the processing case changes the fluid to a supercritical state or maintains the supercritical state while cooling mechanisms cool down the liquid bath moved to the stand-by location outside the processing vessel.

6 Claims, 10 Drawing Sheets

SUPERCRITICAL PROCESSING APPARATUS

SUBSTRATE PROCESSING APPARATUS

CROSS-REFERENCE TO RELATED APPLICATIONS

This application is based on and claims priority from Japanese Patent Application No. 2010-089468, filed on Apr. 8, 2010, with the Japanese Patent Office, the disclosure of which is incorporated herein in its entirety by reference.

TECHNICAL FIELD

The present disclosure relates to a technology that dries a substrate to be processed, which has been undergone, a substrate washing process, etc., using a supercritical fluid.

BACKGROUND

A process of manufacturing a semiconductor device in which a stacking structure of an integrated circuit is formed on the surface of a substrate to be processed such as a semiconductor wafer (hereinafter, referred to as a wafer), includes a liquid process of processing the wafer surface by using a liquid to remove minute dusts or a native oxide layer on the wafer surface with a washing fluid such as a chemical solution.

For example, a single-type spin washing apparatus washing the wafer removes dusts or a native oxide on the wafer surface by rotating the wafer while supplying alkaline or acid chemical solutions to the surface of the wafer by using a nozzle. In this case, after remaining chemical solutions are removed from the wafer surface by rinse washing using, for example, deionized water, and thereafter, the wafer surface is dried by brushing dry of brushing away the remaining solutions by rotating the wafer.

However, with a high integration of the semiconductor device, a problem in so-called a pattern collapse has been growing seriously in a processing of removing the solutions. The pattern collapse is a phenomenon in which at the time of drying the remaining solutions on the wafer surface, the remaining solutions are unevenly dried at the left and right sides of a convex of concave and convex portions forming a pattern, the balance of the surface tension horizontally pulling the convex is lost, and as a result, the convex falls down in a direction in which more solutions remain.

As a technique of removing the solutions remaining on the wafer surface while suppressing the pattern collapse, a drying method using a supercritical liquid-state fluid (a supercritical fluid) is widely known. The supercritical fluid has lower viscosity than that of a liquid, and it also has a higher ability to dissolve the liquid. In addition, there is no interface between a liquid and a gas at an equilibrium state of the supercritical fluid. Therefore, the liquid attached to the wafer is replaced with the supercritical fluid, and thereafter, when the supercritical fluid is changed to a gaseous state, the liquid may be dried without being influenced by the surface tension.

Herein, Japanese Patent Application Laid-Open No. 2008-72118 in paragraphs [0025] to [0029] along with FIG. 1 discloses a technology in which a substrate washed by a washing unit is transferred into a drying apparatus by using a substrate transferring robot and the substrate is brought into contact with the supercritical fluid to remove a washing fluid attached to the surface of the substrate. In the technology disclosed in Paragraphs [0025] to [0029] and FIG. 1 of Japanese Patent Application Laid-Open No. 2008-72118, a substrate to be processed is carried into a transfer chamber to be transferred to the transferring robot. The substrate is then transferred to a drying processing chamber and the corresponding substrate is dried by using the supercritical fluid. As a result, a liquid on the surface of the substrate is dried before the processing starts, and the pattern collapse may occur.

SUMMARY

The present disclosure has been made in an effort to provide a substrate processing apparatus capable of drying a substrate to be processed while suppressing the pattern collapse or a contaminant generation.

An exemplary embodiment of the present disclosure provides a substrate processing apparatus including: a liquid bath configured to hold and immerse a substrate to be processed in a liquid; a processing vessel configured to dispose the liquid bath in an internal processing space, replace the liquid in the liquid bath with a supercritical-state fluid, and depressurize the processing space such that the supercritical-state fluid is changed to a gaseous state, thereby drying the substrate; a fluid supplying unit configured to supply the fluid in a liquid state or a supercritical state to the processing vessel; a liquid discharging unit configured to discharge the liquid in the liquid bath; a moving mechanism configured to move the liquid bath between a processing location in the processing vessel and a stand-by location outside the processing vessel; a heating mechanism configured to heat the processing space in order to change the fluid supplied to the processing vessel to the supercritical state or maintain the supercritical state; and a cooling mechanism configured to cool down the liquid bath moved to the stand-by location.

According to the exemplary embodiments of the present disclosure, when a liquid bath that moves between outside and inside of a processing vessel is moved to a stand-by location outside the processing vessel, this liquid bath can be cooled down and the processing vessel can be heated independently from the liquid bath at the side of the processing vessel. Therefore, when, for example, a substrate is carried in, evaporation of a liquid in the liquid bath or drying of the substrate is suppressed by cooling down the liquid bath outside the processing vessel. Furthermore, because the liquid bath is moved into the processing vessel while maintaining the processing vessel in a heating state, it is possible to shorten the time in which a temperature in the processing vessel increases to a predetermined temperature. As a result, an operation having a high freedom of degree including an improved responsiveness can be achieved.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

In an embodiment of the present disclosure, a substrate processing apparatus is disclosed which comprises: a liquid bath configured to hold and immerse a substrate to be processed in a liquid; a processing vessel configured to dispose the liquid bath in an internal processing space, replace the liquid in the liquid bath with a supercritical-state fluid, and depressurize the processing space such that the supercritical-state fluid is changed to a gaseous state, thereby drying the substrate; a fluid supplying unit configured to supply the fluid in a liquid state or a supercritical state to the processing vessel; a liquid discharging unit configured to discharge the liquid in the liquid bath; a moving mechanism configured to move the liquid bath between a processing location in the processing vessel and a stand-by location outside the processing vessel; a heating mechanism configured to heat the processing space in order to change the fluid supplied to the processing vessel to the supercritical state or maintain the supercritical state; and a cooling mechanism configured to cool down the liquid bath moved to the stand-by location.

In the substrate processing apparatus described above, the liquid is volatile and cooled down by the cooling mechanism before the liquid is supplied to the liquid bath, and the substrate is immersed in the liquid of the liquid bath after the liquid bath is cooled down by the cooling mechanism. Also, the liquid bath is configured to hold the substrate in a longitudinal direction, and the moving mechanism is configured to move the liquid bath in a horizontal direction. Moreover, a covering member is integrally installed in the liquid bath, thereby opening and closing carry-in and out holes formed in the processing vessel, and the liquid bath includes a stopper mechanism configured to prevent the covering member covering an opening from being opened.

Figure 1:
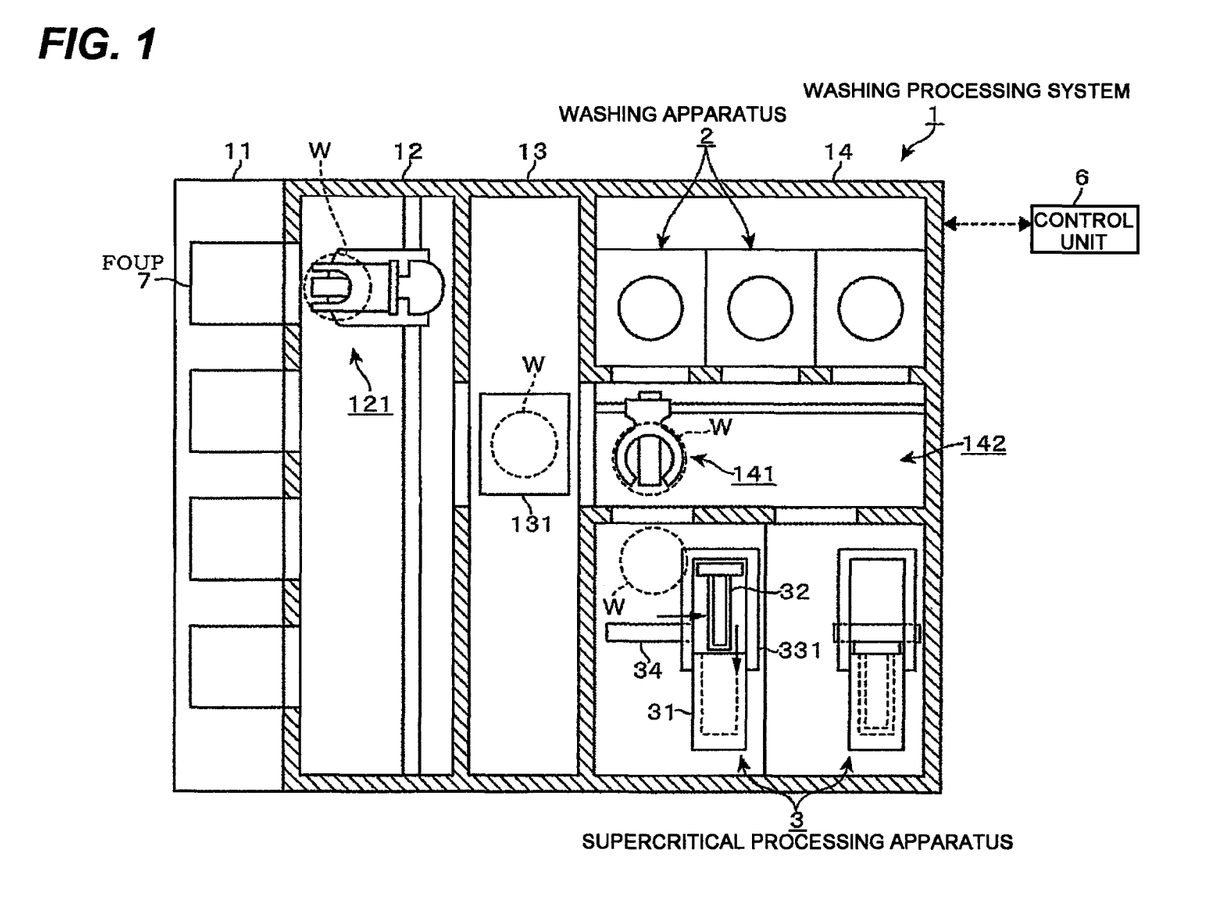
FIG. 1 is a plan view of a washing system according to an exemplary embodiment of the present disclosure.

As one example of a substrate processing system having a substrate processing apparatus according to an exemplary embodiment of the present disclosure, a washing processing system 1 including a washing apparatus 2 washing a wafer W which is a substrate to be processed by supplying a washing fluid to the wafer W and a supercritical processing apparatus 3 drying the washed wafer W by using a supercritical fluid will be described. FIG. 1 is a transverse plan view showing an overall configuration of a washing processing system 1. When a left side is set as a front with respect to the figure, washing processing system 1 includes a loading unit 11 on which a FOUP 7 receiving, for example, several wafers W having a diameter 300 mm is loaded, a carry in/out unit 12 where the wafer W is carried in and out between the FOUP 7 and the washing processing system 1, and a passing unit 13 where the wafer W is passed between carry in/out unit 12 and a wafer processing unit 14 at a rear end. Washing processing system 1 further includes a wafer processing unit 14 where the wafer W is carried into a washing apparatus 2 and a supercritical processing apparatus 3 in sequence to be subjected to a washing processing or a supercritical processing that are connected in the order from the front.

The loading unit 11 is configured by a loading stand capable of loading, for example, four FOUPs 7. Each FOUP 7 loaded on the loading stand is connected to the carry in/out unit 12. In the carry in/out unit 12, by an opening/closing mechanism (not shown) installed on a contact surface with each FOUP 7, an opening/closing door of FOUP 7 is opened, such that a first transfer mechanism 121 which freely advances and retreats in a horizontal direction, freely moves in the horizontal direction, freely rotates, and freely elevates, transfers the wafer W between an inner part of FOUP 7 and passing unit 13. In passing unit 13 of which a front and a rear engage in carry-in/out unit 12 and wafer processing unit 14, respectively, for example, a passing rack 131 that serves as a buffer capable of loading eight wafers W is provided and the wafer W is transferred between carry-in/out unit 12 and wafer processing unit 14 through passing rack 131.

In wafer processing unit 14, a wafer transfer path 142 is installed extending forward and backward from an opening between passing unit 13 and wafer processing unit 14. In addition, at the left side of wafer transfer path 142 when viewed from the front of wafer transfer path 142, for example, three washing apparatuses 2 are installed in line along wafer transfer path 142, and likewise, at the right side of wafer transfer path 142, for example, two supercritical processing apparatuses 3 are installed in line. In wafer transfer path 142, a second transfer mechanism 141 is installed which can move along the wafer transfer path 142, advance and retreat toward the washing apparatus 2 and the supercritical processing apparatus 3 at the left and right sides, rotate, and elevate, such that the wafer W may be transferred between passing rack 131 and each of washing apparatus 2 and supercritical processing apparatus 3. Herein, the number of the washing apparatuses 2 or supercritical processing apparatuses 3 that are disposed in wafer processing unit 14 is not limited to the above-mentioned example, but may be properly selected depending on the number of the wafers W treated per unit hour or a difference in processing time in washing apparatuses 2 or supercritical processing apparatus 3, and further, the layout of washing apparatus 2 or supercritical processing apparatus 3 may also employ a layout different from the example shown in FIG. 1.

Figure 2:
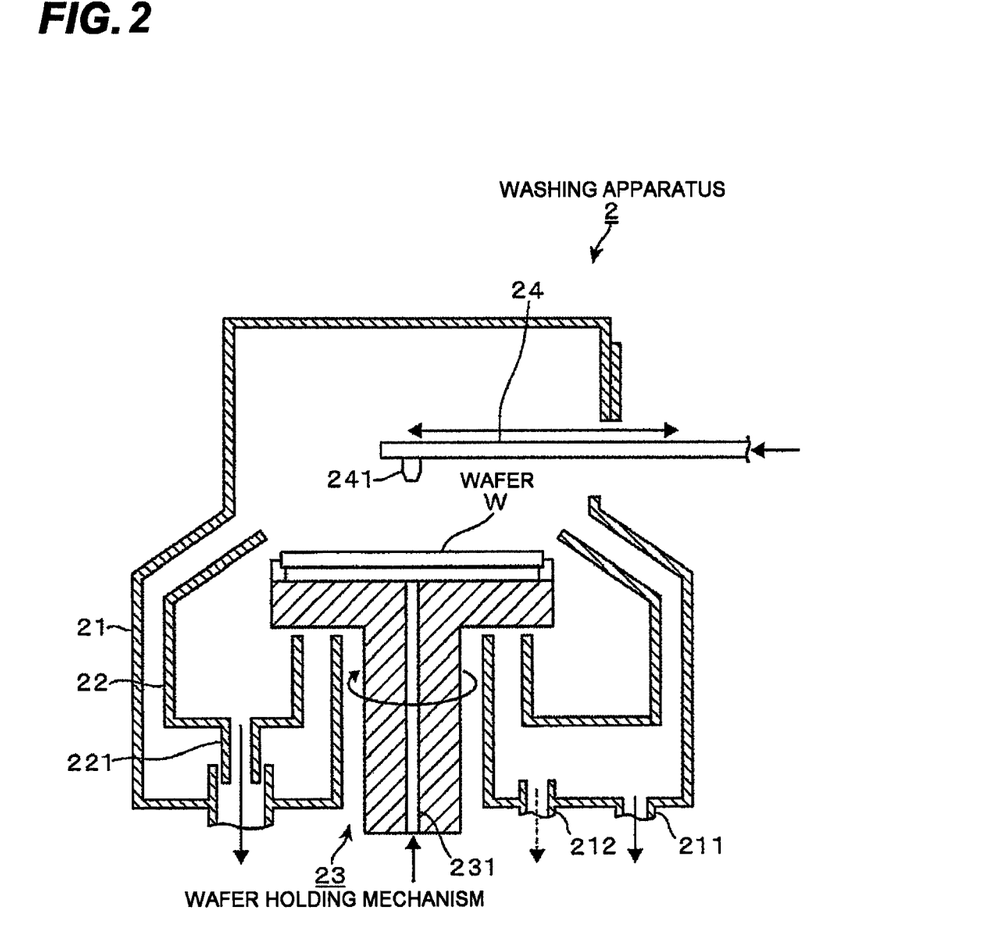
FIG. 2 is a longitudinal cross sectional side view showing one example of a washing apparatus in the washing system.

Washing apparatus 2 is configured by, for example, a single-type washing apparatus washing wafer W one by one by a spin washing, and, for example, as shown in a longitudinal cross sectional side view of FIG. 2, the wafer W is held substantially horizontally by a wafer holding mechanism 23 disposed in an external chamber 21 forming a processing space. The wafer W is rotated as wafer holding mechanism 23 is rotated around the circumference of the vertical shaft. In addition, a nozzle arm 24 enters an upper part of the rotating wafer W to supply a chemical solution and a rinse solution from a chemical solution nozzle 241 installed in the front end thereof in a predetermined order, so that the wafer surface is washed. Further, a chemical solution supplying path 231 is formed even in wafer holding mechanism 23, so back-surface washing of the wafer W is made by using the chemical solution and rinse solution supplied therefrom.

The washing processing is performed sequentially by removal of particles or an organic contaminated material by an SC1 solution (a mixed solution of ammonia and hydrogen peroxide) which is alkaline; rinse washing with deionized water (DIW) which is the rinse solution; removal of a native oxide layer by an aqueous hydrofluoric acid solution (hereinafter, diluted hydrofluoric acid (DHF)); and rinse washing with the DIW. The chemical solution is received in an inner cup 22 disposed in an external chamber 21 or external chamber 21, and discharged from drain holes 221 and 211. Further, an atmosphere in external chamber 21 is exhausted from an exhaust port 212.

When the washing processing by the chemical solution is completed, wafer holding mechanism 23 stops rotating, and isopropyl alcohol (IPA) for preventing drying is supplied to the surface thereof to be replaced with DIW remaining on the surface and the back surface of the wafer W. The wafer W which has been subjected to the washing processing is transferred to second transfer mechanism 141 by a passing mechanism (not shown) installed in, for example, wafer holding mechanism 23 with the IPA is being attached to the surface thereof, and then is carried out from washing apparatus 2.

The wafer W which has been subjected to the washing processing in washing apparatus 2 is transferred to supercritical processing apparatus 3 with the IPA is being attached to the surface thereof, and thereafter, a supercritical processing is performed in which a liquid is removed from the surface of the wafer W by using the supercritical fluid and the wafer W is dried. Hereinafter, a configuration of supercritical processing apparatus 3 according to the exemplary embodiment of the present disclosure will be described with reference to FIGS. 3 to 6. In FIGS. 3 to 10, the configuration will be described with setting a left side as a front side with respect to the figures.

Figure 3:
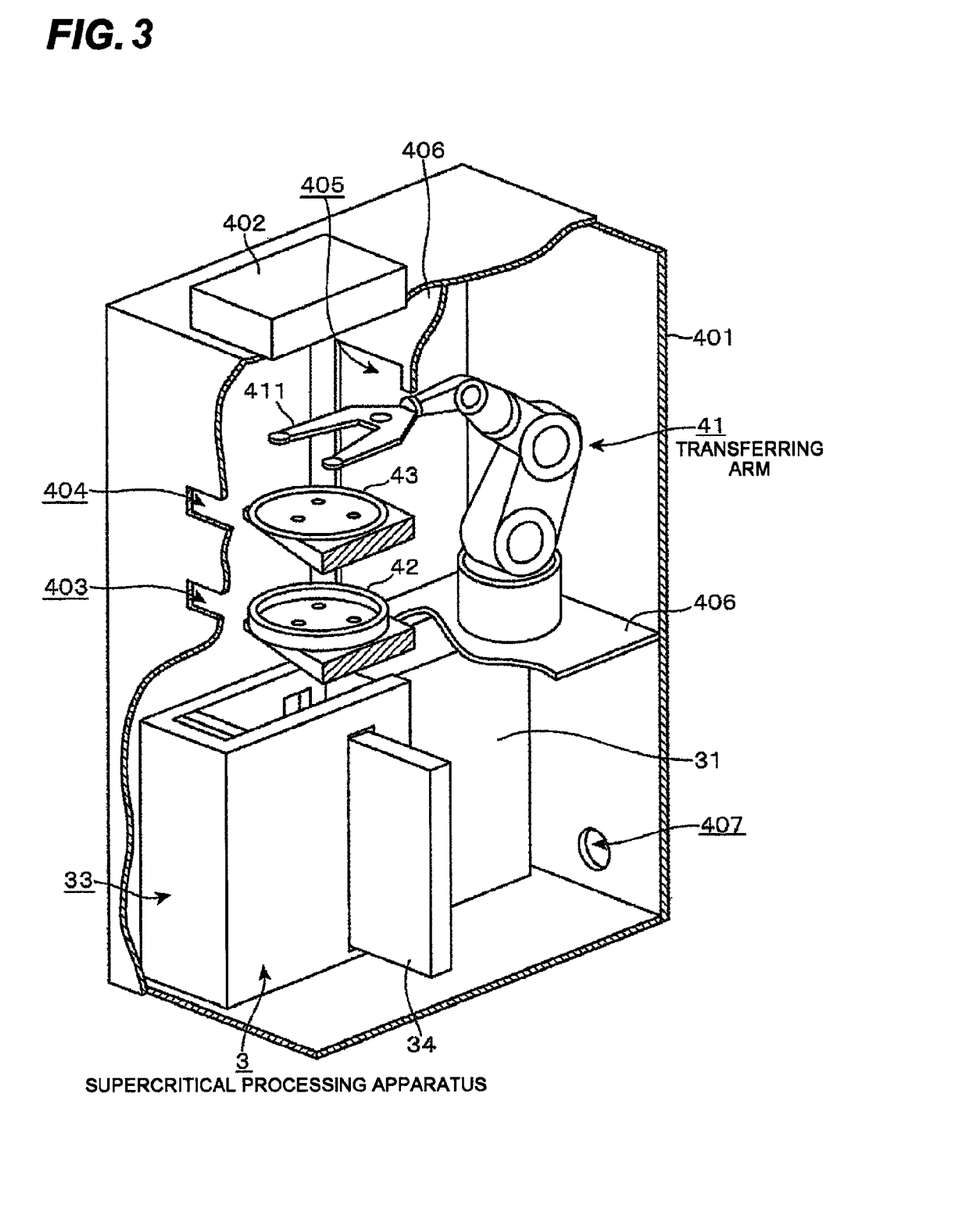
FIG. 3 is a perspective view showing examples of a supercritical processing apparatus and a wafer passing mechanism according to an exemplary embodiment of the present disclosure.

FIG. 3 is a partial fracture perspective view showing an inner part of a case 401 storing each of supercritical processing apparatus 3. Supercritical processing apparatus 3 is disposed on, for example, a bottom surface in each case 401, and the passing mechanism passing the wafer W between the supercritical processing apparatus 3 and the second transfer mechanism 141 is installed in a space located above the bottom surface. In this example, the passing mechanism is provided with a passing arm 41 holding and transferring the wafer W, a carry-in rack 42 on which the wafer W carried into supercritical processing apparatus 3 before the supercritical processing is exclusively loaded, and a carry-out rack 43 on which the processed wafer W carried out from supercritical processing apparatus 3 after the supercritical processing is exclusively loaded.

Passing arm 41 is disposed, for example, around the upper rear portion of supercritical processing apparatus 3 disposed on a base of case 401, and is, for example, a 6-shaft multi-jointed arm capable of holding wafer one by one by gripping the lateral circumferential surface of the wafer W by a fork 411 installed at the front end thereof. Further, passing arm 41 is installed in a space partitioned by a partition plate 406 to prevent particles generated due to the operation of passing arm 41 from entering a space to which the wafer W is transferred. In the figure, reference numeral 405 represents an access entrance for allowing passing arm 41 to enter a space where the wafer W is passed.

Carry-in rack 42 and the carry-out rack 43 are installed so that two racks 42 and 43 stands in line vertically, for example, around the upper front portion of supercritical processing apparatus 3, and carry-in rack 42 in which a wafer W before the supercritical processing is placed is disposed in a lower side and the carry-out rack 43 in which a wafer W after the supercritical processing is placed is disposed in an upper part. Carry-in and out racks 42 and 43 are configured as loading racks capable of holding wafer W one by one horizontally, and for example, the wafer W may be transferred between second transfer mechanism 141 and passing arm 41 through a three-line elevation pin installed on each of racks 42 and 43.

Further, carry-in rack 42 has a dish shape capable of being filled with the liquid and the wafer W is kept in an immersed state in IPA supplied from an IPA supplying unit (not shown) so that natural drying of the surface of the wafer W is prevented. As a result the generation of the pattern collapse is prevented before the supercritical processing.

In addition, when the inside of case 401 is viewed from the front side and the placement locations of carry-in rack 42 and carry-out rack 43 are viewed from the front side, racks 42 and 43 are disposed around the upper side portion of an internal chamber 32, which is opened toward the top surface from a stand-by location where the wafer W is transferred to prepare the supercritical processing. As a result, a wafer. W transfer path to internal chamber 32 opened toward the top surface is ensured to rapidly transfer the wafer W without interfering with carry-in rack 42 or carry-out rack 43.

In FIG. 3, in washing apparatus 2, reference numeral 403 represents a carry-in hole through which the wafer W is carried in after the washing processing is completed, and reference numeral 404 represents a carry-out hole through which a wafer W is carried out after the supercritical processing is completed. Second transfer mechanism 141 enters case 401 through carry-in and out holes 403 and 404. Further, in FIG. 3, reference numeral 402 represents a fan filter unit (FFU) for forming downflow of cleaned air in case 401 and reference numeral 407 represents an exhaust port of the downflow.

Figure 4:
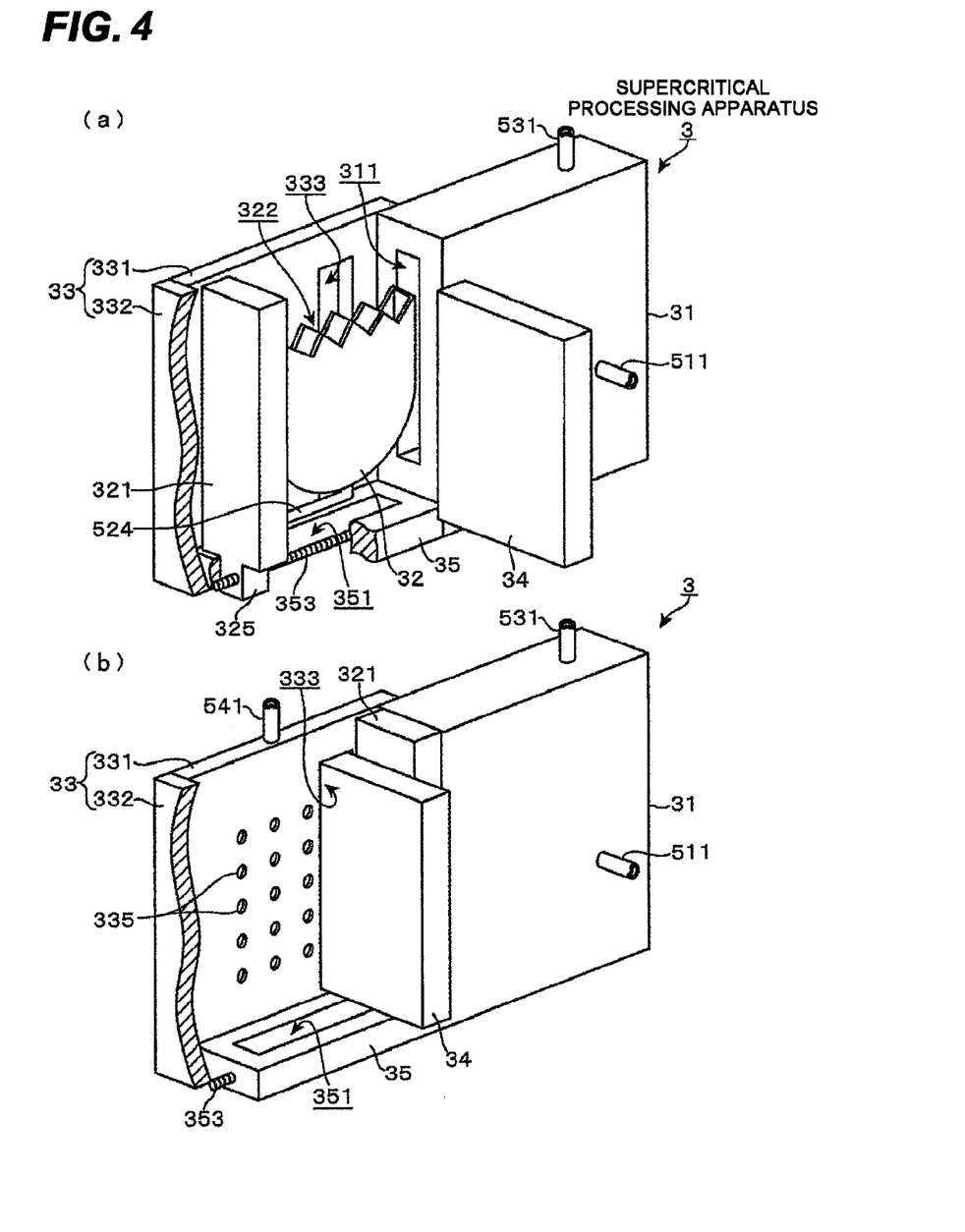
FIG. 4 is a partial fracture perspective view showing an exterior configuration of the supercritical processing apparatus.
Figure 5:
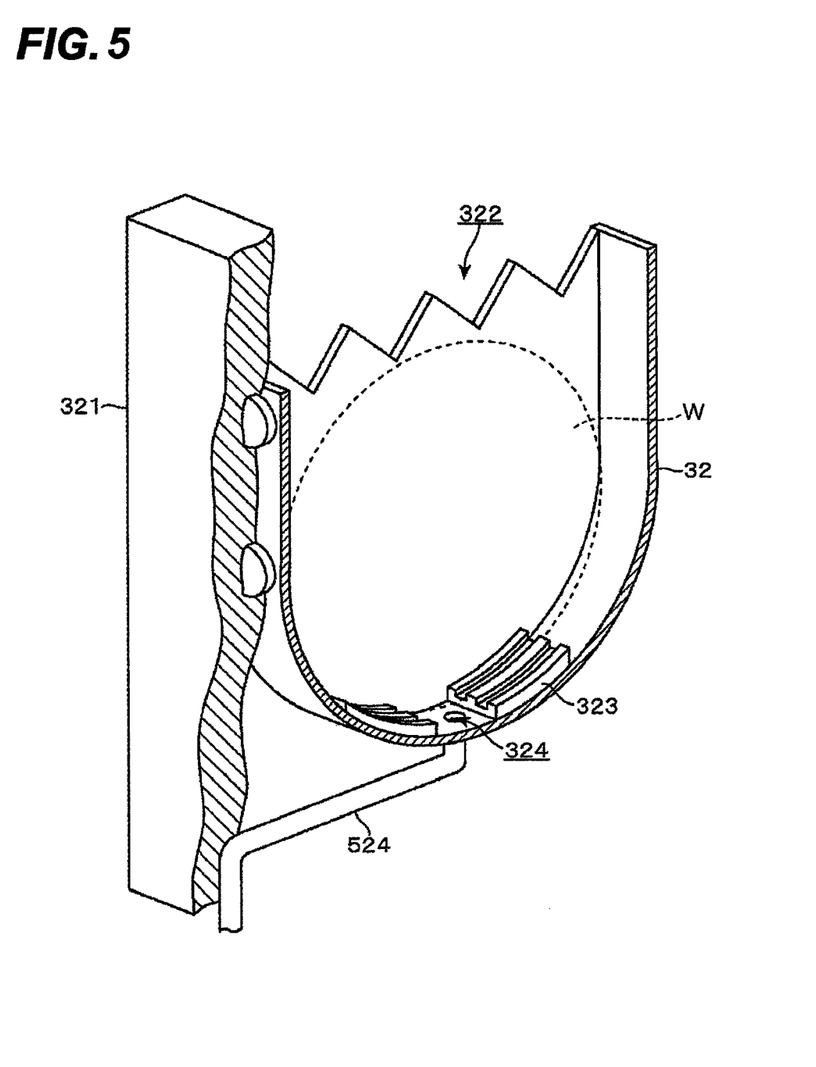
FIG. 5 is a partial fracture perspective view showing a configuration of an internal chamber installed in the supercritical processing apparatus.

For example, supercritical processing apparatus 3 installed in each case 401 have the substantially same configuration as each other and may perform the supercritical processing of drying the wafer W without forming a gas-liquid interface on the surface of the wafer W by using the supercritical fluid. As shown in FIGS. 4 and 5, the supercritical processing apparatus 3 includes an external chamber 31 which corresponds to a processing container where the supercritical processing is made and an internal chamber 32 which carried the wafer W into external chamber 31 while the wafer W is immersed in the IPA. Internal chamber 32 corresponds to a liquid bath of the exemplary embodiment.

Figure 6:
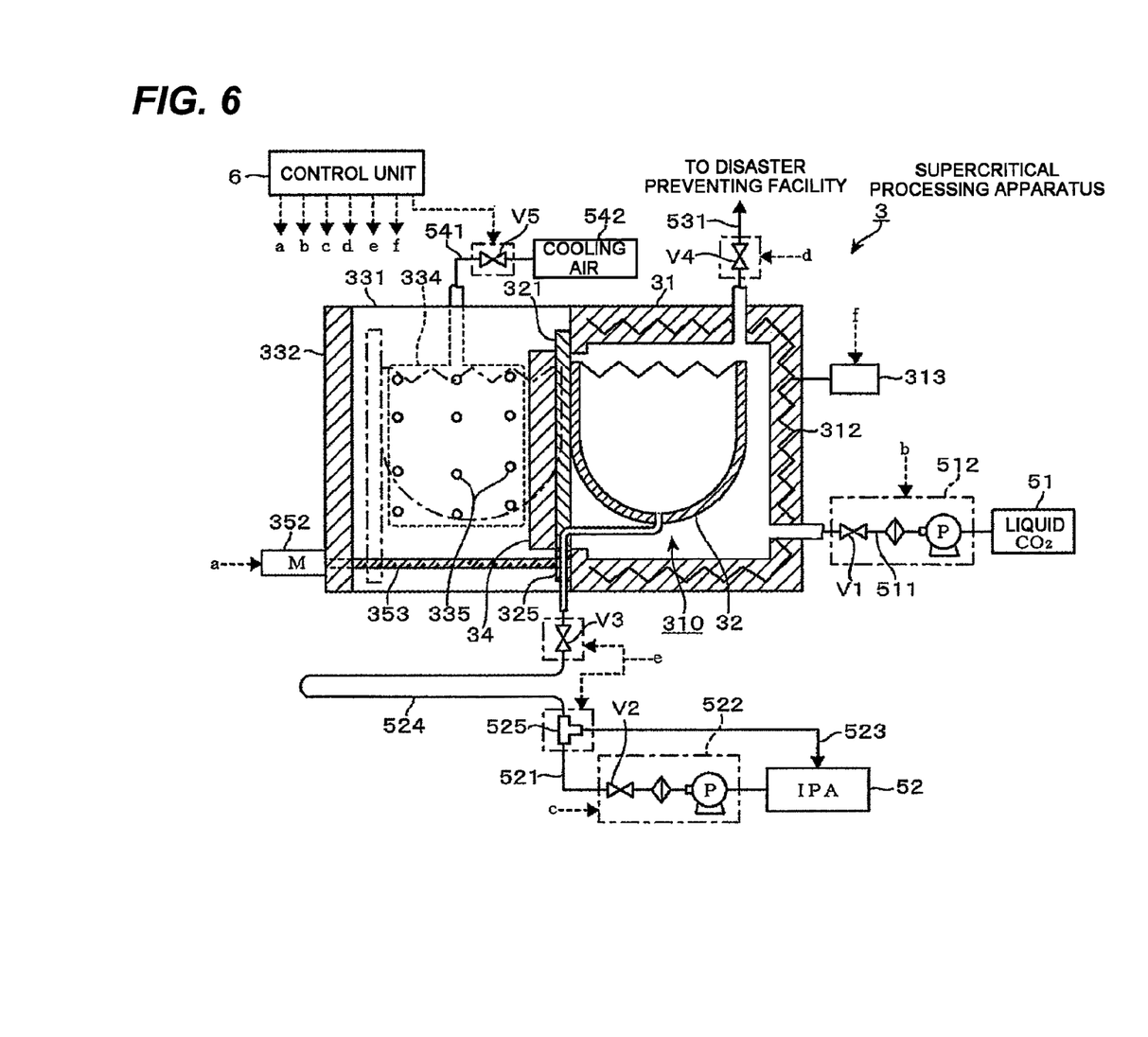
FIG. 6 is an explanation diagram showing supplying and discharging systems of various treatment fluids to the supercritical processing apparatus.

As shown in each figure of FIG. 4, external chamber 31 is configured by a cubic shaped pressure-resistant vessel which is flat in the longitudinal direction and as shown in FIG. 6, external chamber 31 includes a processing space 310 housing the internal chamber 32 therein. As shown in FIG. 1, in the external chamber 31, a surface having a smaller width is disposed to face wafer transfer path 142 and an opening 311 for carrying in and out internal chamber 32 is formed on the front surface thereof (see FIG. 4A).

Further, as shown in FIG. 6, a heater 312 constituted by, for example, a resistant heating element is installed in external chamber 31 to heat a main body of external chamber 31 by using power supplied from a power supply unit 313, and as a result, for example, liquid $CO_2$ supplied to the inside of processing space 310 may be in a supercritical state. Further, in the exemplary embodiment, power supply unit 313 is operable to increase and decrease its power for adjusting the temperatures of the main body of external chamber 31 and processing space 310. Heater 312 corresponds to a heating mechanism of the exemplary embodiment.

Further, as shown in FIG. 4, a $CO_2$ supplying line 511 is connected to a position around a base of the side of the main body of external chamber 31, and $CO_2$ supplying line 511 is connected to a $CO_2$ storing unit 51 through a solution sending mechanism 512 constituted by a valve V1, a filter, and a pump as shown in FIG. 6. The liquid $CO_2$ is stored in $CO_2$ storing unit 51, and $CO_2$ supplying line 511, solution sending mechanism 512, and $CO_2$ storing unit 51 constitute a substitution fluid supplying unit for supplying the liquid $CO_2$ to the inside of processing space 310 of external chamber 31.

Further, as shown in FIGS. 4 and 6, for example, reference numeral 531 represents an exhaust line which is installed on a ceiling surface of the main body of external chamber 31 and is used for depressurizing an inner part of a processing case 31 by exhausting an atmosphere in the processing space at the time of supplying the liquid $CO_2$ to processing space 310 and exhausting $CO_2$ of the supercritical state which is subjected to the completion of the supercritical processing, and serves to exhaust and seal the inner part of processing space 310 with opening and closing of a valve V4. Herein, valve V4 also serves as a pressure regulating valve and may exhaust the atmosphere in processing space 310 while regulating the pressure in processing space 310. Further, from a point of exhausting the $CO_2$ of the supercritical state after processing, exhaust line 531 corresponds to an exhaust unit of the exemplary embodiment.

As shown in FIGS. 4A and 5, internal chamber 32 is a case formed to house, for example, two wafers W in the longitudinal direction and may hold the wafers W in the state in which the wafers W are immersed in the IPA which is a dry preventing liquid. Internal chamber 32 has a flat shape in the longitudinal direction, which has a width smaller than processing space 310. Therefore, when internal chamber 32 is disposed in processing space 310, a space for allowing the liquid $CO_2$ or the supercritical $CO_2$ supplied to processing space 310 to be circulated is formed between an inner surface of external chamber 31 and an outer surface of internal chamber 32. Internal chamber 32 according to the exemplary embodiment of the present disclosure is configured to store, for example, two wafers W in order to satisfy a necessity of making the volume of processing space 310 handling the supercritical fluid as small as possible and a balancing with a wafer W processing speed of the entire washing processing system 1. However, the number of the wafers W that can be stored in internal chamber 32 is not limited thereto, but only one or three or more wafers W may be stored in internal chamber 32. Further, in the case in which several wafers W are stored in internal chamber 32, surfaces of, for example, adjacent wafers W with patterns may be disposed to face each other to prevent particles from being attached to the surfaces. In the case in which the number of the wafers W is odd, a pattern formed surface of one remaining wafer W may face another wafer W to prevent the pattern formed surface from facing a wall surface of internal chamber 32.

As shown in FIG. 5, the top surface of internal chamber 32 has an opening and the wafer W held on the passing arm 41 is carried into internal chamber 32 through the opening. Further, for example, a saw-like notch unit 322 is formed in the opening of internal chamber 32 to allow the supercritical fluid in processing space 310 to easily flow into internal chamber 32. However, for convenience of illustration, in the figures other than FIGS. 4A, 5, and 6, notch unit 322 of internal chamber 32 is not shown.

Further, a base of the internal chamber 32 has a shape curved along the shape of the wafer W and a wafer holding member 323 for holding two wafers W is installed on the inner bottom surface thereof. A groove having the same shape as that of the wafer W is formed in wafer holding member 323 and the periphery of the wafer W is fitted in the groove to keep the wafer W in the longitudinal direction. Further, in wafer holding member 323, the IPA supplied to internal chamber 32 sufficiently contacts with the surface of the respective wafer W. Further, even though fork 411 holding the wafer W enters internal chamber 32, placement locations of the grooves or intervals between the grooves are adjusted so that the wafer W or fork 411 does not interfere with other wafers W or a main body of internal chamber 32.

As shown in FIG. 5, a region without wafer holding member 323 is provided on the bottom surface of internal chamber 32, and an opening 324 is formed therein, which is a liquid draining portion for supplying the IPA to internal chamber 32 and discharging the IPA. Opening 324 is connected to an IPA supplying and discharging line 524 which is connected to a changeover valve 525 through an inner part of a covering member 321 to be described below (see FIG. 6). As described below, since internal chamber 32 can move forward and backward, supplying and discharging line 524 is configured by, for example, a flexible pipe having a pressure resistance.

Therefore, it can be transformed with the movement of internal chamber 32. In FIG. 6, reference numeral V3 represents a valve.

Changeover valve 525 is connected to an IPA supplying line 521 for supplying the IPA to internal chamber 32, a recovery line 523 for recovering the IPA discharged from internal chamber 32, and supplying and discharging line 524 as described above. IPA supplying line 521 is connected to an IPA storing unit 52 storing the IPA through solution sending mechanism 522 constituted by an open/close valve V2, a filter, and a pump. Meanwhile, recovery line 523 is connected directly to IPA storing unit 52 to recover the IPA discharged from internal chamber 32.

As shown in FIG. 5, internal chamber 32 is fixed to, for example, the covering member 321 having a thick plate-shape on the side having a small width. In addition, by moving covering member 321 forward and backward in the horizontal direction, internal chamber 32 may be moved between a stand-by location outside external chamber 31 and a processing location in processing space 310 where the wafer W is passed between internal chamber 32 and passing arm 41. Further, as expressed by a dashed line in FIG. 6, covering member 321 transferring internal chamber 32 to the processing location also serves to open and close opening 311 of external chamber 31. An O-ring (not shown) is installed around opening 311 of external chamber 31 to surround opening 311, and covering member 321 seals the processing space 310 by tightly pushing the O-ring.

As shown in FIGS. 4A and 4B, covering member 321 is supported on a bearing stand 35. Bearing stand 35 has a travel track 351 thereon, which cuts bearing stand 35 in a direction of transferring internal chamber 32. Meanwhile, a travelling member 325 that starts to extend downwardly toward the inside of travelling track 351 is installed at a lower end of covering member 321. In addition, as shown in FIGS. 4A and 6, a ball screw 353 extended throughout travelling track 351 penetrates travelling member 325, and travelling member 325 and ball screw 353 constitute a ball screw mechanism. The ball screw mechanism corresponds to a moving mechanism moving internal chamber 32.

In addition, travelling member 325 travels within travelling track 351 by rotating ball screw 353 in any one direction of left and right directions using a driver installed at one end of ball screw 353, and as a result, covering member 321 is moved to transfer internal chamber 32 from the stand-by location up to the processing location. Further, when internal chamber 32 is transferred from the processing location to the stand-by location, ball screw 353 is rotated in an opposite direction thereto. However, a mechanism for moving covering member 321 is not limited to the above-described ball screw mechanism, but covering member 321 may be moved, for example, by a linear motor, an extendable arm, or an air cylinder.

Further, as shown in FIGS. 4A and 4B, a circumferential wall 33 is installed in supercritical processing apparatus 3 to cover the region where covering member 321 or internal chamber 32 moves, from the side. Circumferential wall 33 includes two side wall members 331 extending in the travelling direction of covering member 321, and a front wall member 332 installed with facing opening 311 of the external chamber 31. In addition, one end of the external chamber of each of the two side wall member 331 is strongly fixed to the side wall surface of external chamber 31, and as a result, circumferential wall 33 is integrally formed with external chamber 31.

Further, supercritical processing apparatus 3 includes a fixation plate 34 for strongly pressing covering member 321 toward external chamber 31 against internal pressure applied to covering member 321, and preventing covering member 321 from being opened by keeping $CO_2$ in the supercritical state within processing space 310. Fixation plate 34 is configured to move horizontally between a retreat location retreated from the region where internal chamber 32 and covering member 321 move, and a fixation location where covering member 321 is fixed toward external chamber 31 from the front, by using a driving mechanism (not shown).

Meanwhile, a fitting hole 333 into which the fixation plate 34 that moves horizontally can penetrate is formed in each side wall member 331 and fixation plate 34 that stands by at a stand-by location outside circumferential wall 33 (the side wall member 331) passes through fitting hole 333 of side wall member 331 at one side to move to a fixation location. Further, both left and right ends of fixation plate 34 moved to the fixation location are fitted in the fitting hole 333. As a result, fixation plate 34 is locked to the side wall member 331 like a 'latch' to strongly press covering member 321 toward external chamber 31 against the pressure in processing space 310 (see supercritical processing apparatus 3 of FIG. 1 and FIG. 4B). Fixation plate 34 serving to prevent covering member 321 from being opened and side wall member 331 having the fitting hole 333 constitute a stopper mechanism of the exemplary embodiment.

Further, in supercritical processing apparatus 3 according to the exemplary embodiment of the present disclosure, a cooling mechanism for cooling internal chamber 32 that moved to the outside of external chamber 31, such as, for example, the stand-by location is installed. As shown in FIGS. 4B and 6, the cooling mechanism according to the exemplary embodiment of the present disclosure, for example, includes ejection holes 335 of cooling air formed in a side wall member 331 of a circumferential wall 33, a diffusion space 334 formed in the side wall member 331 in order to supply the cooling air to ejection holes 335, and a cooling air supplying unit 542 connected to diffusion space 334 through a cooling air supplying line 541.

Ejection holes 335 are a plurality of opened aperture portions formed on a wall surface of side wall member 331 so as to face left and right side wall surfaces of internal chamber 32 that is carried out from external chamber 31 and moved to, for example, the stand-by location when viewed from the front side. Ejection hole 335 serves to cool internal chamber 32 by spraying the cooling air to internal chamber 32.

Diffusion space 334 is formed in the inside of side wall member 331 in order to supply the cooling air to each of ejection holes 335. Cooling air supplying line 541 enables or disables the supplying of the cooling air to diffusion space 334 by opening or closing an open/close valve V5 interposed in line 541. Further, cooling air supplying unit 542 is constituted by, for example, air supplying pipes for a compressor or a factory power usage to supply cleaned cooling air to diffusion space 334 through cooling air supplying line 541.

Washing processing system 1 including supercritical processing apparatus 3 having the above-mentioned configuration is connected to a control unit 6 as shown in FIGS. 1 and 6. Control unit 6 is constituted by, for example, a computer including a CPU and a memory unit (not shown). In the memory unit, a program is recorded in which a group of control-related steps (instructions) associated with the operations of washing processing system 1, or washing apparatus 2 and supercritical processing apparatus 3 are programmed. Specifically, the operations includes the following 4 sub-operations, (i) the wafer W is taken out from FOUP 7, (ii) the wafer W is transferred to washing apparatus 2, (iii) the wafer W is subjected to the supercritical processing in supercritical processing apparatus 3, and (iv) the wafer W is carried into FOUP 7. The program is stored in memory media such as a hard disk, a compact disk, a magnet optical disk, and a memory card and installed in the computer therefrom.

In particular, in regards to supercritical processing apparatus 3, control unit 6 is connected to each of solution sending mechanisms 512 and 522 of $CO_2$ supplying line 511 and IPA supplying line 521 to control the supplying timing of the liquid $CO_2$ or IPA, and in addition, to control the discharge pressure of solution sending mechanism 512 based on a detection value of a pressure gauge (not shown) installed in external chamber 31, as shown in FIG. 6. Further, control unit 6 may control the opening/closing timing of each of valves V1 to V5, the timing of rotation, direction of rotation, an amount of rotation of the ball screw 353 by the driver 352, and switching of the lines (IPA supplying line 521 and the recovery line 523) to be connected to the changeover valve 525. Moreover, control unit 6 also serves to control the temperature in processing space 310 to a predetermined temperature by increasing and decreasing electric power to be supplied to heater 312 from power supply unit 313 on the basis of a temperature detection result in processing space 310 measured from a thermometer (not shown), and further, also controls the timing of operating the cooling mechanism in order to cool down internal chamber 32 moved up to the stand-by location.

An operation of supercritical processing apparatus 3 having the above-mentioned configuration will be described. As previously described in detail, when the washing processing is completed in washing apparatus 2 and the wafer W to which the dry preventing IPA is attached is transferred by second transfer mechanism 141, second transfer mechanism 141 enters any one case 401 through carry-in hole 403 and transfers the wafer W to the elevation pin of carry-in rack 42 on the basis of, for example, a predetermined processing schedule.

In the case in which the wafer W can be immediately carried in internal chamber 32 of supercritical processing apparatus 3, fork 411 of passing arm 41 enters a lower part of the wafer W just as the wafer W is received in the carry-in rack 42, and then, the elevation pin is moved down to transfer the wafer W to fork 411. In the case in which a waiting time is generated until the wafer W is carried in internal chamber 32, the wafer W is placed in a dish-like carry-in rack 42 by moving down the elevation pin, and the IPA is supplied to the surface of the wafer W to prevent drying. In addition, when a preparation is completed in internal chamber 32, the wafer W is transferred to fork 411 by moving up the elevation pin.

Figure 7:
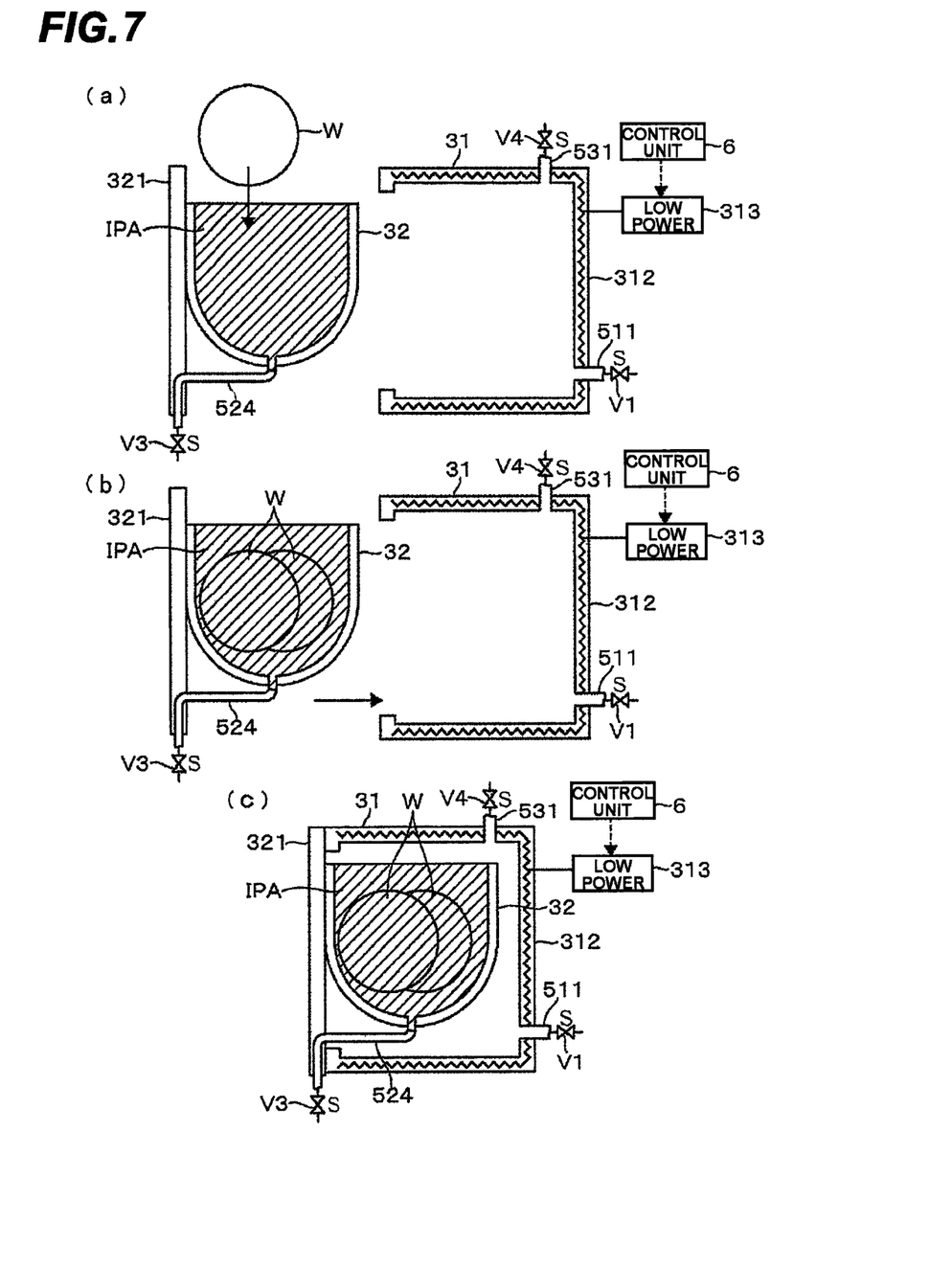
FIG. 7 is a first explanation diagram showing an operation of the supercritical processing apparatus.

Meanwhile, internal chamber 32 stands by at the stand-by location while the IPA is filled in internal chamber 32 as shown in FIG. 7A. Passing arm 41 that receives the wafer W from carry-in rack 42 raises uprightly the wafer W in the longitudinal direction and rotates each rotation shaft so that the front end of fork 411 faces the opening of internal chamber 32, and thereafter, moves down fork 411 to allow the wafer W to enter internal chamber 32.

By rapidly executing the carry-in operation, when the posture of the wafer W is changed to the longitudinal direction, even though some of the IPA attached to the surface of the wafer W is spilled and dropped, a liquid film of IPA remains on the surface of the wafer W only for a short time. Therefore, while the liquid film remains, the wafer W is carried in internal chamber 32, such that the wafer W is immersed in the IPA of internal chamber 32 before the surface of the wafer W is dried, that thereby transferring the wafer W while suppressing the occurrence of the pattern collapse.

When the lower end of the wafer W is held while being fitted in the groove of wafer holding member 323 by further moving down fork 411, fork 411 is retreated from internal chamber 32 by releasing the holding of the wafer W by fork 411 and moving up passing arm 41. In addition, by repetitively performing the passing operation with respect to two wafers W, the two wafers W are held in internal chamber 32 and immersed in the IPA, as schematically shown in FIG. 7B.

As described above, while the carry-in operation of the wafer W to internal chamber 32 is executed, for example, the output power of power supply unit 313 is set as the low power at the side of external chamber 31. In the exemplary embodiment, for example, the main body of external chamber 31 is preheated to a temperature lower than the critical temperature of $CO_2$ and higher than an atmospheric temperature in case 401 where supercritical processing apparatus 3 is installed, for example, approximately 28° C.

In addition, when two wafers W are held on internal chamber 32, internal chamber 32 is moved up to the processing location by driving ball screw 353 by driver 352 (see FIG. 7C). In this case, valve V3 of supplying and discharge line 524 is closed to disable the IPA to be discharged from internal chamber 32 (written as 'S' in FIG. 7C, hereinafter, the same as above). Further, even in external chamber 31, valves V1 and V4 of $CO_2$ supplying line 511 and exhaust line 531 are closed, respectively.

In addition, as shown in FIG. 4B, when fixation plate 34 is moved up to a fixation location from a stand-by, valve V1 of solution sending mechanism 512 at the side of $CO_2$ supplying line 511 is opened location (written as 'O' in FIG. 8A, hereinafter, the same as above) and the pump is actuated to supply the liquid $CO_2$ to processing space 310. For example, when the liquid $CO_2$ is supplied to processing space 310 under atmospheric pressure, some of the liquid $CO_2$ is vaporized, and as a result, the pressure in processing space 310 is increased, and a vapor-phase side atmosphere is in equilibrium with the liquid $CO_2$.

Figure 8:
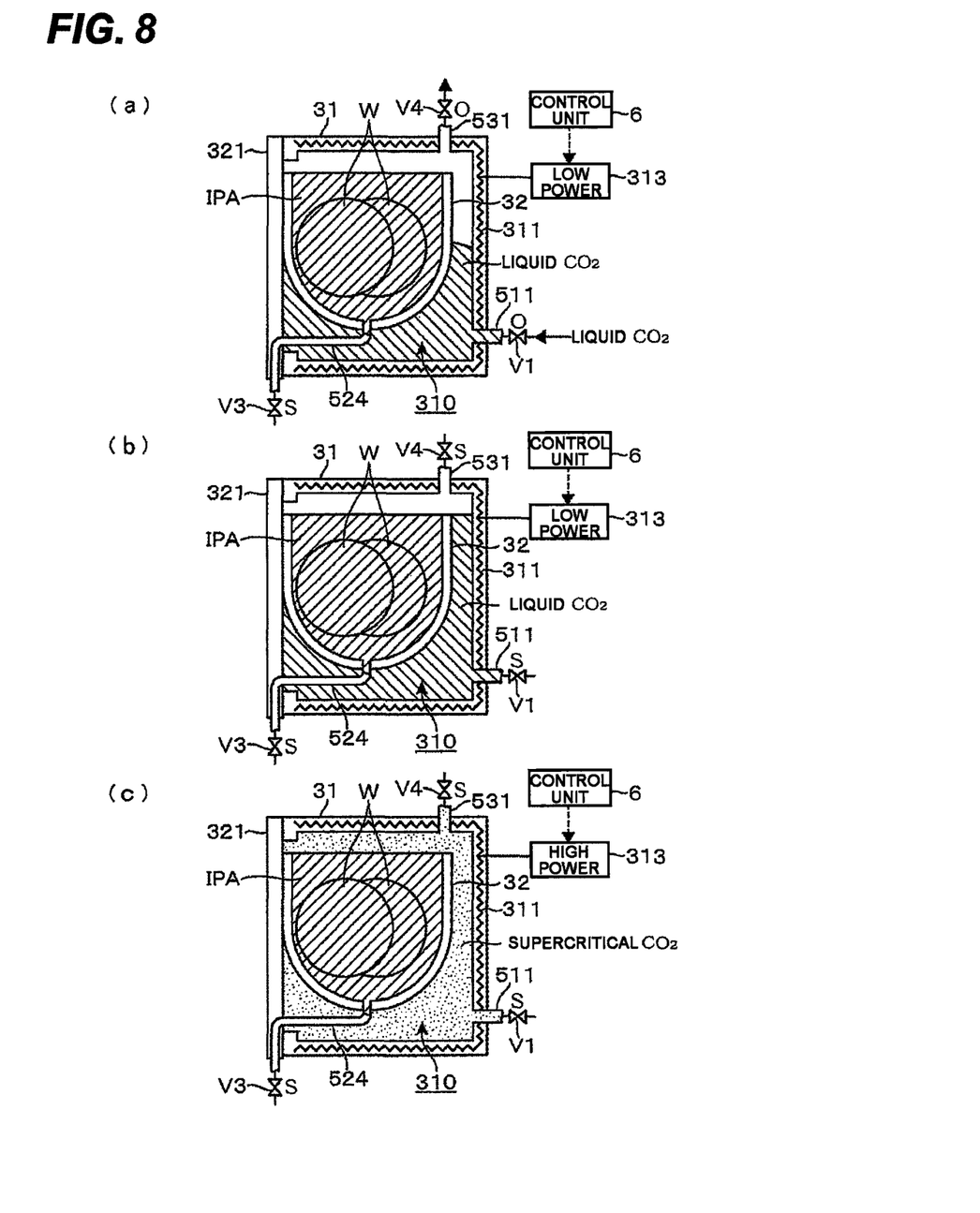
FIG. 8 is a second explanation diagram showing an operation of the supercritical processing apparatus.

Thereafter, when valve V4 is opened while controlling an opening level so that the atmosphere in processing space 310 is, for example, 7.5 MPa within the range of, for example, 6 MPa to 9 MPa, the vapor-phase atmosphere is sent out while the $CO_2$ supplied from the $CO_2$ supplying line 511 is kept in a liquid state, so the inner part of processing space 310 is being replaced with the liquid $CO_2$ (see FIG. 8A). Even in this case, a power from power supply unit 313 is set as a low power. And, a main body of external chamber 31, internal chamber 32 in the processing space 310, the wafer W, or the liquid $CO_2$ is preheated at a temperature lower than a critical temperature of $CO_2$ and higher than that of an external atmosphere, for example, approximately 28° C.

In addition, when a liquid level of the liquid $CO_2$ reaches even a location around a lower end of notch unit 322 of internal chamber 32 shown in FIG. 5, and the liquid $CO_2$ can thus flow into internal chamber 32, valves V1 and V4 of $CO_2$ supplying line 511 and exhaust line 531 are closed to seal external chamber 31 (see FIG. 8B).

Subsequently, as shown in FIG. 8C, a power feeding amount to heater 312 is increased by changing the output power of power supply unit 313 to a high power to heat processing space 310 so that the temperature in processing space 310 is, for example, 40° C. within the range of 30 to 90° C. Since a critical point of $CO_2$ is at 7.38 MPa and 31.1° C., the liquid $CO_2$ is changed to the supercritical state through the heating operation, and a gas-liquid interface of $CO_2$ is disappeared, therefore processing space 310 is filled with the supercritical-state $CO_2$.

Figure 9:
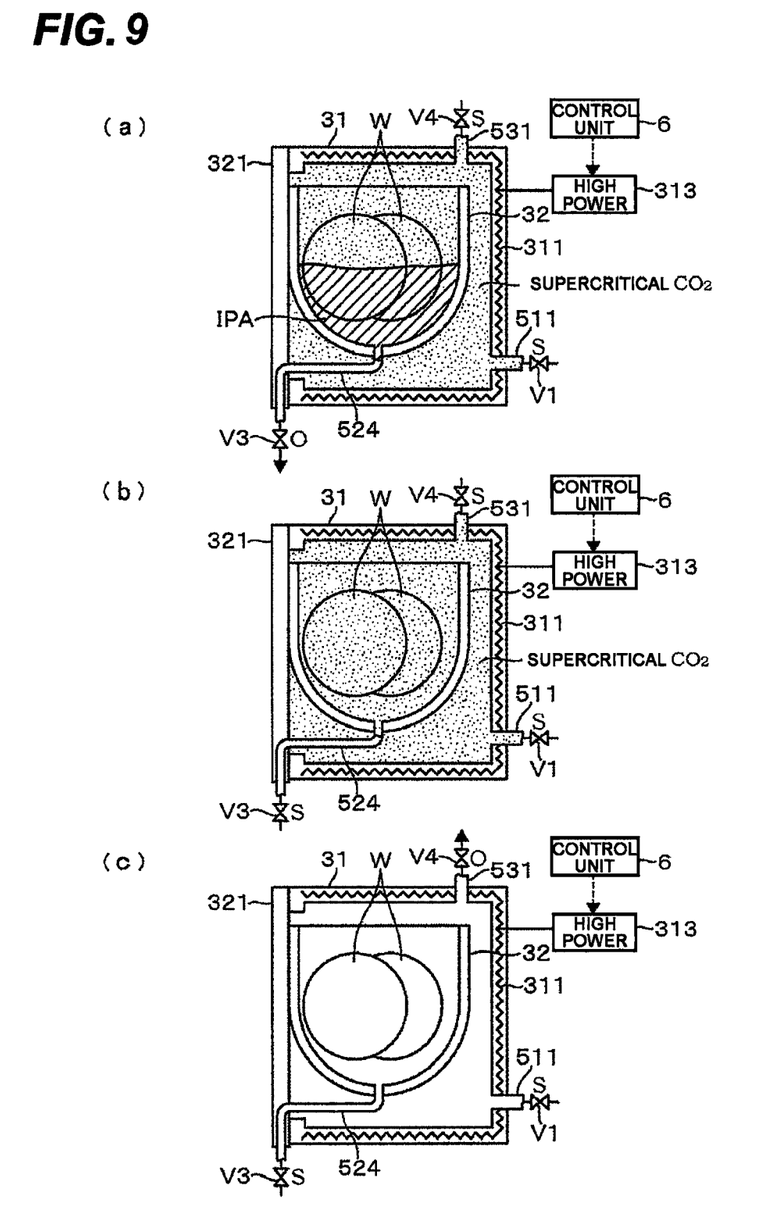
FIG. 9 is a third explanation diagram showing an operation of the supercritical processing apparatus.

Herein, since the boiling point of IPA under the atmospheric pressure is 82.4° C., the IPA in internal chamber 32 maintains a liquid state 7.5 MPa and 40° C. in processing space 310 and the surface of the wafer W immersed in the IPA is also in a wet state. In this case, as shown in FIG. 9A, when valve V3 of supplying and discharging line 524 is opened, the WA in internal chamber 32 is pushed out by the supercritical-state $CO_2$ through the opening of internal chamber 32, and also gravity is applied, so the IPA flows toward supplying and discharging line 524. In this case, by switching changeover valve 525 shown in FIG. 6 to recovery line 523, the IPA flowed out from internal chamber 32 is recovered in IPA storing unit 52.

When the IPA is flowed out from supplying and discharging line 524 connected to the bottom surface of internal chamber 32, the supercritical-state $CO_2$ in processing space 310 is expanded to enter internal chamber 32 through an opening on the top thereof. As a result, since the IPA in internal chamber 32 is being replaced with the supercritical-state $CO_2$ from the upper part to the lower part while the surface tension does not act on the supercritical-state $CO_2$, an atmosphere on the surface of the wafer W may be changed from the liquid IPA to the supercritical-state $CO_2$ without causing the pattern collapse.

In this case, as the IPA is replaced with the supercritical-state $CO_2$ toward the lower part from the upper part of internal chamber 32, the dusts dispersed from the wafer W is flowed toward liquid passing hole 324 on the base of internal chamber 32 together with the IPA at the time of discharging the IPA, and as a result, the wound-up of the dusts is suppressed to prevent the dusts from being reattached to the wafer W.

Herein, as described above, since internal chamber 32 has a size to store two wafers W, the volume thereof is relatively small. Therefore, in the state in which the temperature and pressure of the supercritical-state $CO_2$ are sufficiently higher than critical points, when an anticipated amount of $CO_2$ taking in consideration of decrease in temperature or pressure by the expansion is, in advance, supplied into processing space 310, the supercritical state of $CO_2$ may be sufficiently maintained. Further, for example, even though the IPA in internal chamber 32 is flowed out and the supercritical-state $CO_2$ is expanded, the power of heater 312 may be increased to maintain the supercritical state.

In addition, in this case, external chamber 31 and processing space 310 are preheated at a temperature higher than the external atmosphere and lower than the critical temperature of $CO_2$ by heater 312. As a result, external chamber 31 is configured to be thick in order to achieve pressure resistance, such that the temperature in processing space 310 may increase to a desired temperature within a shorter time even in the case in which the heat capacity of external chamber 31 is large than in the case in which the temperature of external chamber 31 decreases up to the same temperature as the external atmosphere.

In such a manner, when the IPA in internal chamber 32 is discharged and the atmosphere in processing space 310 is all substituted to the supercritical-state $CO_2$, valve V3 of the supplying and discharging line 524 is closed (see FIG. 9B), and valve V4 of exhaust line 531 is opened to depressurize processing space 310 up to the atmospheric pressure. As a result, although the supercritical-state $CO_2$ is changed to a gaseous state, no interface is formed between the supercritical state and gas. Therefore, the wafer W may be dried without applying the surface tension to the pattern formed on the surface (see FIG. 9C).

In this case, in internal chamber 32, since the wafer W is kept in the longitudinal direction, for example, even in the case in which dusts such as particles attached to the wafer W are dispersed along the flow of the IPA or the supercritical-state $CO_2$, the surface of the wafer W is not provided at a location where the dusts move down by gravity, and as a result, it is difficult for the wafer W to be re-contaminated.

Herein, in an example shown in FIG. 9C, processing space 310 is depressurized by using exhaust line 531 exhausting an atmosphere in external chamber 31 at the time of supplying the liquid $CO_2$. However, in order to prevent dusts from being wound up due to the upward flow of $CO_2$ formed in processing space 310 at the time of the depressurizing operation, the depressurization may be, for example, performed while a downward flow is formed in processing space 310 by installing the exhaust line only for depressurization on the base of external chamber 31. Further, the depressurization may be performed by supplying and discharging line 524 connected to the bottom of internal chamber 32. In addition, at the time of depressurizing processing space 310, the internal temperature of processing space 310 may be increased by heater 312 so as to prevent the IPA solved in the supercritical-state $CO_2$ from being condensed on the surface of the wafer W because of the temperature drop in processing space 310 caused by the expansion of $CO_2$.

By the process, when the supercritical processing of the wafer W is terminated, fixation plate 34 is retreated up to a retreat location, and covering member 321 is moved to the front side to move internal chamber 32 up to the stand-by location, and fork 411 enters internal chamber 32 to take out treated wafer W one by one.

In addition, the taken-out wafer W is transferred to first transfer mechanism 121 via carry-out rack 43, and is stored in FOUP 7 through a reverse path to that in the carry-in of the wafer W, and as a result, a series of operations for the wafer W are completed.

Figure 10:
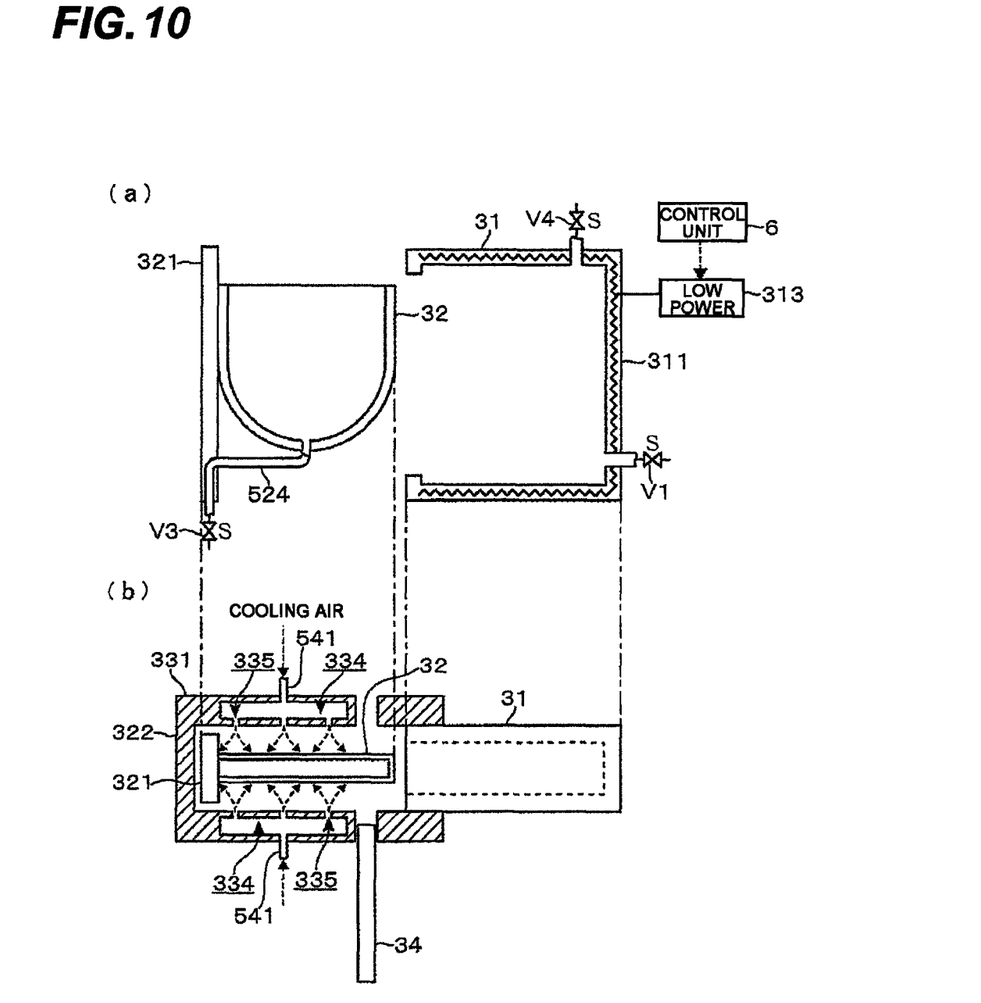
FIG. 10 is a fourth explanation diagram showing an operation of the supercritical processing apparatus.

Meanwhile, as shown in FIGS. 10A and 10B, when the wafer W moves up to the stand-by location, internal chamber 32 is heated up to a temperature equal to or higher than 31.1° C. which is the same as the temperature of processing space 310 immediately after the supercritical processing is completed, for example, a temperature in the range of 40 to 90° C. When IPA having high volatility is supplied to internal chamber 32 heated up to the temperature, the evaporation amount of IPA increases, and, as a result, the amount of IPA that cannot be recovered to IPA storing unit 52 increases. Further, the evaporated IPA is diffused into the case 401, such that a load of a disaster preventing facility at the rear end of down-flow exhaust port 407 may increase. Furthermore, in the case in which the temperature of internal chamber 32 or covering member 321 supporting the same increases, when the wafer W is transferred to a location around internal chamber 32 before the supercritical processing, the wafer W is heated with heat emitted from internal chamber 32 to promote the drying of the IPA attached to the surface thereof, thereby causing the pattern collapse.

Therefore, in supercritical processing apparatus 3 according to the exemplary embodiment of the present disclosure, the cooling air is ejected toward internal chamber 32 from an ejection hole 335 formed in side wall member 331 to decrease the temperature of the main body of internal chamber 32 or covering member 321 supporting the same in a short period of time, as shown in FIG. 10B. As a result, when internal chamber 32 is cooled to, for example, a temperature equal to or lower than the temperature of a surrounding atmosphere, a connection point of changeover valve 525 is switched to IPA supplying line 521, and solution sending mechanism 522 is actuated to supply IPA from the IPA storing unit 52 and in the state in which the IPA is filled in internal chamber 32, carry-in of the next wafer W is waited.

In order to avoid a rapid evaporation of IPA adhered to the wafer W by cooling air sprayed directly to the wafer W, it may be considered to stop cooling internal chamber 32 prior to starting the carry-in operation of the wafer W to internal chamber 32.

Meanwhile, by changing the power of power supply unit 313 to the low power, external chamber 31 is on stand-by while the main body of external chamber 31 is maintained at the above-mentioned preheating temperature by heater 312.

Supercritical processing apparatus 3 according to the exemplary embodiment of the present disclosure provides the following effects. When internal chamber 32 that moves inside and outside external chamber 31 is moved to the outside (for example, the stand-by location of the wafer W) of external chamber 31, internal chamber 32 may be cooled by spraying the cooling air and at the side of external chamber 31, while external chamber 31 is heated independently from internal chamber 32.

Therefore, like supercritical processing apparatus 3 according to the exemplary embodiment of the present disclosure, for example, at the time of carry in the wafer W, internal chamber 32 is cooled down outside of external chamber 31 to suppress the evaporation of IPA or drying of the wafer W in internal chamber 32, while external chamber 31 maintains the preheated state. Therefore, it is possible to improve the responsiveness by shortening the time to increase the temperature in the processing vessel to a predetermined temperature after the liquid bath moves into the processing vessel, thereby implementing an operation having a high freedom degree.

Herein, in the exemplary embodiment, an example in which external chamber 31 after internal chamber 32 is carried out is preheated at the temperature lower than the critical temperature of $CO_2$ and higher than the temperature of the surrounding atmosphere has been described. However, the temperature condition of external chamber 31 during the time when internal chamber 32 is carried out and remains on stand-by, is not limited to a specific temperature to which external chamber 31 is pre-heated. For example, heater 312 is turned off by stopping power feeding from power supply unit 313 to be on stand-by as a natural cooling state. Even if a cooling mechanism is provided capable of independently cooling internal chamber 32 carried out to the outside of external chamber 31, it is possible to suppress the evaporation of IPA or drying of the wafer W in internal chamber 32, as well.

Further, external chamber 31 may be heated up to a temperature higher than the critical temperature of $CO_2$ to be on a stand-by state, and in this case, for example, the liquid $CO_2$ supplied to processing vessel 310 is immediately changed into the supercritical state and the supercritical-state $CO_2$ may be configured to be replaced with IPA in internal chamber 32. Herein, $CO_2$ supplied to the processing vessel 31 is not limited to the case in which $CO_2$ is supplied in the liquid state, and the supercritical-state $CO_2$ may be previously supplied to the processing vessel 31. In this case, heater 312 serves to maintain the supercritical state of $CO_2$.

Furthermore, the timing to cool internal chamber 32 by the cooling mechanism is not limited to the timing before supplying the IPA to internal chamber 32. For example, internal chamber 32 may be cooled down at a timing after the IPA is supplied and before the wafer W is immersed in the IPA.

In addition, the stand-by location to cool the internal chamber by the cooling mechanism does not always need to coincide with the location where the wafer W is passed. For example, when internal chamber 32 is moved to the outside of external chamber 31, internal chamber 32 may be cooled while the wafer W after the supercritical processing is maintained at the stand-by location just prior to the location where the wafer W is passed, and thereafter, internal chamber 32 may be moved to the passing location after the cooling.

Besides, the configuration of the cooling mechanism cooling internal chamber 32 is not limited to the scheme in which cooling gas such as air is sprayed from ejection hole 335 formed in side wall member 331 as described above. For example, a flowing path that allows a refrigerant to flow is provided on the outer surface of the main body of internal chamber 32, or the main body of internal chamber 32 has a jacket shape in which the refrigerant can flow therein to cool internal chamber 32. Further, for example, a Peltier element or a heat absorber cooled by the refrigerant may be closely attached to a wall surface of a case of internal chamber 32.

In addition, a heating mechanism of external chamber 31 is not limited to a case in which the heating mechanism is formed by a resistance heating element. For example, external chamber 31 may be heated by forming a flowing path that allows a heating medium to flow in the main body of external chamber 31.

Further, although the example in which the IPA as the liquid in which the wafer W is immersed and the $CO_2$ as the supercritical-state fluid substituted with the liquid are employed, has been described in each exemplary embodiment, the example of each fluid is not limited thereto. For example, instead of supplying the dry preventing IPA to the washed wafer W, the wafer W may be immersed in the DIW which is the rinse solution (washing solution), which may be replaced with the supercritical fluid. Further, for example, in a case in which hydrofluoroether (HFE) is used as the supercritical fluid, the wafer W may be disposed in external chamber 31 in the state in which the wafer W is immersed in the liquid HFE to replace the liquid HFE with supercritical-state HFE. Further, the IPA may be used as the supercritical-state fluid.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus, comprising:
    a liquid bath configured to hold and immerse a substrate to be processed in a liquid;
    a processing vessel configured to dispose the liquid bath in an internal processing space, replace the liquid in the liquid bath with a supercritical-state fluid, and depressurize the processing space such that the supercritical-state fluid is changed to a gaseous state, thereby drying the substrate;
    a fluid supplying unit configured to supply the fluid in a liquid state or a supercritical state to the processing vessel;
    a moving mechanism configured to move the liquid bath between a processing location within the processing vessel and a stand-by location outside the processing vessel where the substrate is exchanged;
    a heating mechanism configured to heat the processing space in order to change the fluid supplied to the processing vessel to the supercritical state or maintain the supercritical state; and
    a cooling mechanism provided at the stand-by location outside the processing vessel and configured to cool down the liquid bath moved to the stand-by location while the processing vessel is being heated independently from the liquid bath,
    wherein the cooling mechanism is provided in a location to face the outer surface of the liquid bath at the stand-by location outside the processing vessel such that the liquid bath is cooled at the stand-by location either with or without the substrate being disposed in the liquid bath.

2. The substrate processing apparatus of claim 1, wherein the liquid is volatile and cooled down by the cooling mechanism before the liquid is supplied to the liquid bath.

3. The substrate processing apparatus of claim 1, wherein the substrate is immersed in the liquid of the liquid bath after the liquid bath is cooled down by the cooling mechanism.

4. The substrate processing apparatus of claim 1, wherein the liquid bath is configured to hold the substrate in a longitudinal direction.

5. The substrate processing apparatus of claim 1, wherein the moving mechanism is configured to move the liquid bath in a horizontal direction.

6. The substrate processing apparatus of claim 1, wherein a covering member is integrally installed in the liquid bath, thereby opening and closing carry-in and out holes formed in the processing vessel, and wherein the liquid bath includes a stopper mechanism configured to prevent the covering member covering an opening from being opened.

* * * * *